(12) United States Patent
Kasat et al.

(10) Patent No.: US 10,437,946 B1
(45) Date of Patent: Oct. 8, 2019

(54) USING IMPLEMENTED CORE SOURCES FOR SIMULATION

(71) Applicant: Xilinx, Inc., San Jose, CA (US)

(72) Inventors: Amit Kasat, Hyderbad (IN);
Shreegopal S. Agrawal, Hyderabad (IN); Venkat Prasad Aleti, Hyderabad (IN)

(73) Assignee: XILINX, INC., San Jose, CA (US)

( * ) Notice: Subject to any disclaimer, the term of this patent is extended or adjusted under 35 U.S.C. 154(b) by 345 days.

(21) Appl. No.: 15/255,013

(22) Filed: Sep. 1, 2016

(51) Int. Cl.
*G06F 17/50* (2006.01)

(52) U.S. Cl.
CPC ...... *G06F 17/5009* (2013.01); *G06F 17/5045* (2013.01)

(58) Field of Classification Search
CPC .................................................. G06F 17/5045
USPC ........................................................ 703/14
See application file for complete search history.

(56) References Cited

U.S. PATENT DOCUMENTS

| | | | | |
|---|---|---|---|---|
| 5,845,106 A * | 12/1998 | Stapleton | ............ | G06F 17/5022 703/21 |
| 6,333,649 B1 * | 12/2001 | Dick | ............ | G06F 1/0328 327/105 |
| 6,591,402 B1 * | 7/2003 | Chandra | ............ | G06F 17/5022 716/106 |
| 6,606,588 B1 * | 8/2003 | Schaumont | ......... | G06F 17/5022 703/15 |
| 6,678,645 B1 * | 1/2004 | Rajsuman | ........... | G06F 17/5022 703/14 |
| 6,833,730 B1 * | 12/2004 | Ganesan | .......... | H03K 19/17728 326/41 |
| 7,243,330 B1 * | 7/2007 | Ganesan | ............ | G06F 17/5045 716/102 |
| 7,268,594 B1 * | 9/2007 | Alfke | ..................... | G06F 1/025 327/105 |
| 7,337,100 B1 * | 2/2008 | Hutton | ................ | G06F 17/5068 703/13 |
| 7,557,619 B1 | 7/2009 | Dick et al. | | |
| 7,587,625 B2 * | 9/2009 | Alexander | ............ | G06F 11/106 714/42 |
| 7,934,185 B1 | 4/2011 | Ballagh et al. | | |
| 8,032,852 B1 * | 10/2011 | Sinclair | ............... | G06F 17/5077 716/116 |
| 8,091,057 B1 | 1/2012 | Suthar et al. | | |

(Continued)

OTHER PUBLICATIONS

Mishchenko et al. ("Improvements to Technology Mapping for LUT-Based FPGAs", ACM, 2006, pp. 1-10).*

(Continued)

*Primary Examiner* — Kamini S Shah
*Assistant Examiner* — Iftekhar A Khan
(74) *Attorney, Agent, or Firm* — Kevin T. Cuenot (57) ABSTRACT

Using pin planning for core sources includes identifying, using a processor, a first pin configuration and a second pin configuration for a core source of a behavioral description of a circuit design. The second pin configuration is generated by a pin planning operation. The first pin configuration of the core source can be compared with the second pin configuration of the core source using a processor. Responsive to detecting a difference between the first pin configuration and the second pin configuration, the core source can be automatically update, using the processor, based upon the second pin configuration.

20 Claims, 4 Drawing Sheets

(56) References Cited

U.S. PATENT DOCUMENTS

| | | | |
|---|---|---|---|
| 8,185,850 B1* | 5/2012 | Schumacher | G06F 17/504 716/103 |
| 8,302,041 B1* | 10/2012 | Chan | G06F 17/5072 716/104 |
| 8,352,526 B1 | 1/2013 | Alfke | |
| 8,407,433 B2* | 3/2013 | Wingard | G06F 12/0607 711/157 |
| 8,769,450 B1* | 7/2014 | Tian | G06F 17/504 716/103 |
| 8,775,986 B1* | 7/2014 | Mohan | G06F 17/5054 716/104 |
| 8,788,553 B1 | 7/2014 | Lee et al. | |
| 8,868,396 B1* | 10/2014 | Shirazi | G06F 17/5022 703/13 |
| 8,881,079 B1 | 11/2014 | Pan et al. | |
| 8,996,906 B1* | 3/2015 | Townley | G06F 1/06 713/600 |
| 9,081,930 B1* | 7/2015 | Neuendorffer | G06F 17/505 |
| 9,147,024 B1* | 9/2015 | Kathail | G06F 17/5045 |
| 9,183,334 B1* | 11/2015 | Zhang | G06F 17/50 |
| 9,183,339 B1* | 11/2015 | Shirazi | G06F 17/5054 |
| 9,703,900 B1* | 7/2017 | Dhume | G06F 17/5022 |
| 2002/0016706 A1* | 2/2002 | Cooke | G01R 31/318342 703/20 |
| 2003/0066057 A1* | 4/2003 | RuDusky | G06F 17/5045 717/140 |
| 2005/0055617 A1* | 3/2005 | Wang | G01R 31/318335 714/727 |
| 2005/0102125 A1* | 5/2005 | Tseng | G06F 13/22 703/14 |
| 2006/0059447 A1* | 3/2006 | Ariyama | G06F 17/5068 716/126 |
| 2007/0283311 A1* | 12/2007 | Karoubalis | G06F 17/5054 326/38 |
| 2008/0109782 A1* | 5/2008 | Adelman | G06F 17/5027 716/116 |
| 2008/0320254 A1* | 12/2008 | Wingard | G06F 12/0607 711/157 |
| 2009/0006659 A1* | 1/2009 | Collins | H04L 63/0245 710/8 |
| 2010/0122011 A1* | 5/2010 | Arimilli | G06F 13/385 710/316 |
| 2010/0122105 A1* | 5/2010 | Arslan | G06F 15/7867 713/500 |
| 2010/0122107 A1* | 5/2010 | Arimilli | G06F 13/4022 713/600 |
| 2010/0218157 A1* | 8/2010 | McMurchie | G06F 17/5054 716/129 |
| 2011/0029830 A1* | 2/2011 | Miller | G06F 11/221 714/734 |
| 2011/0119646 A1* | 5/2011 | Murray | G06F 17/505 716/102 |
| 2011/0145778 A1* | 6/2011 | Chen | G06F 17/5054 716/136 |
| 2011/0145779 A1* | 6/2011 | Chen | G06F 17/5054 716/137 |
| 2011/0145780 A1* | 6/2011 | Chen | G06F 17/5054 716/137 |
| 2011/0145781 A1* | 6/2011 | Chen | G06F 17/5054 716/137 |
| 2013/0083611 A1* | 4/2013 | Ware | G11C 11/4072 365/191 |
| 2014/0105230 A1* | 4/2014 | Kabiry | H04J 3/02 370/537 |
| 2015/0234008 A1* | 8/2015 | Miller | G01R 31/3177 714/734 |
| 2015/0234960 A1* | 8/2015 | Schubert | H03M 3/46 703/14 |
| 2016/0342727 A1* | 11/2016 | Sarwary | G06F 17/5031 |

OTHER PUBLICATIONS

Moussa et al. ("Comparing RTL and Behavioral Design Methodologies in the Case of a 2M-Transistor ATM Shaper", ACM, 1999, pp. 1-7) (Year: 1999).*

* cited by examiner

USING IMPLEMENTED CORE SOURCES FOR SIMULATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This disclosure relates to circuit design and integrated circuits (ICs). More particularly, this disclosure relates to using implemented core sources for simulation.

BACKGROUND

Behavioral simulation is a high level simulation of the architecture of a digital system. Behavioral simulation is performed using a behavioral description of digital system, e.g., a circuit design, that exists at an early stage of a design flow. One example of a behavioral description is a circuit design expressed programmatically as a register transfer level (RTL) description. The RTL description describes the behavior of the digital system as data transfers that occur between registers each clock cycle. Hardware description languages such as VHDL and Verilog can be used to specify RTL descriptions.

In some cases, portions of the circuit design expressed in RTL are pin dependent. The pin dependent portions may have default pin configurations. These pin configurations often change during one or more stages of a design flow through which the behavioral description of the circuit design is processed.

SUMMARY

An example embodiment includes a method of using pin planning for core sources. The method may include identifying, using a processor, a first pin configuration and a second pin configuration for a core source of a behavioral description of a circuit design. The second pin configuration is generated by a pin planning operation. The method may include comparing, using the processor, the first pin configuration of the core source with the second pin configuration of the core source and, responsive to detecting a difference between the first pin configuration and the second pin configuration, automatically updating, using the processor, the core source based upon the second pin configuration.

Another example embodiment includes a system for using pin planning for core sources. The system includes a processor configured to initiate executable operations. The executable operations include identifying a first pin configuration and a second pin configuration for a core source of a behavioral description of a circuit design. The second pin configuration is generated by a pin planning operation. The executable operations may include comparing the first pin configuration of the core source with the second pin configuration of the core source and, responsive to detecting a difference between the first pin configuration and the second pin configuration, automatically updating the core source based upon the second pin configuration.

Another example embodiment includes a computer program product. The computer program product includes a computer readable storage medium having program code stored thereon. The program code is executable by a processor to perform operations for using pin planning for core sources. The operations include identifying, using the processor, a first pin configuration and a second pin configuration for a core source of a behavioral description of a circuit design. The second pin configuration is generated by a pin planning operation. The operations may include comparing, using the processor, the first pin configuration of the core source with the second pin configuration of the core source, and responsive to detecting a difference between the first pin configuration and the second pin configuration, automatically updating, using the processor, the core source based upon the second pin configuration.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to circuit design and, more particularly, to using implemented core sources for simulation. Circuit designs may include one or more core sources specified as register transfer level (RTL) descriptions. In many cases, one or more of the core sources included in a circuit design have portions that are pin independent and portions that are pin dependent. The pin dependent portions of the core sources typically have default pin configurations. The default pin configurations may specify or include default pin assignments, whether for internal or external pins of the circuit design. Typically, however, pin planning is not performed until later stages of a design flow. This means that a behavioral simulation, which operates on the behavioral description of the circuit design, is performed using these default pin configurations. Often, the default pin configurations are not used in the circuit design as implemented within a target IC, thereby causing a discrepancy between what is behaviorally simulated and what is actually implemented. Using the default pin configurations for a behavioral simulation can reduce accuracy of the simulation and/or allow errors to go unnoticed.

In example embodiments described within this disclosure, the circuit design may be processed through one or more stages of a design flow including a pin planning stage. For example, the circuit design may be linked, synthesized, and/or placed with pin planning being performed as part of and/or following one or more of these design flow stages. The pin planning often results in a new pin configuration for pin dependent portions of the circuit design.

Subsequent to a pin planning stage, the pin configuration of the circuit design may be analyzed to determine whether the current pin configuration is different from an earlier, original, or default pin configuration. Responsive to determining that the current pin configuration is different from the prior pin configuration, pin dependent portions of one or more core sources of the circuit design may be updated with the new pin configuration.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
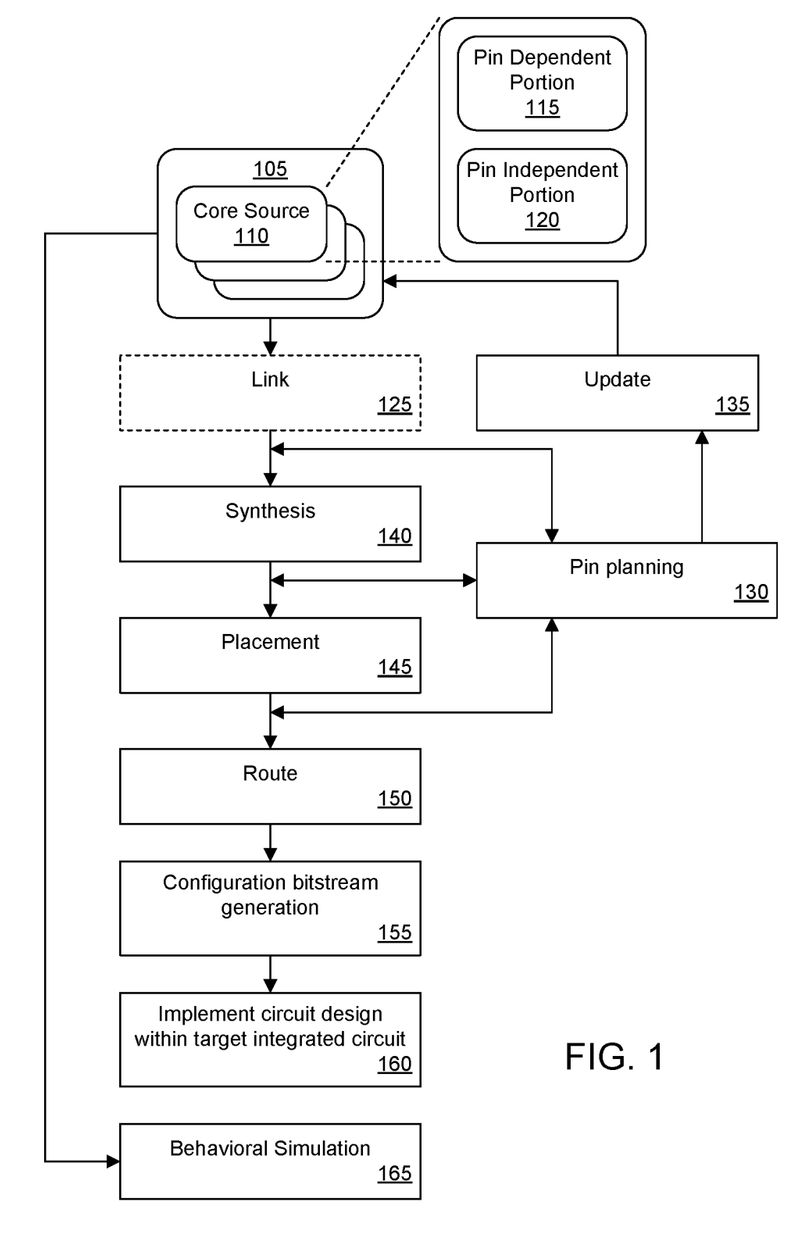
FIG. 1 is a block flow diagram illustrating an example of using implemented core sources in a simulation.

FIG. 1 is a block flow diagram illustrating an example of using implemented core sources in a simulation. FIG. 1 illustrates example operations as blocks that may be performed by an electronic design automation (EDA) system. In one example, an EDA system may be implemented as a data processing system, e.g., a computer, executing suitable software.

As pictured, a circuit design 105 can be processed through one or more stages of a design flow as implemented by the system. Implementing a circuit design within an IC, whether a programmable IC or an application specific IC (ASIC), entails processing the circuit design through a design flow. The design flow includes multiple, different stages. These stages generally include linking (optional), synthesis, placement, and routing. An optimization stage may also be included.

Circuit design 105 includes one or more core sources 110. Core sources 110 can be specified as RTL descriptions. As noted, RTL may be specified as any of a variety of hardware description languages (HDLs). Example HDLs include, but are not limited to, VHDL and Verilog. One or more of core sources 110 can include a pin dependent portion 115 and a pin independent portion 120.

As used within this disclosure, the term "pin dependent" means that the characteristics of a node of a circuit design vary and/or depend upon the particular pin (e.g., internal pin or external pin) to which the node of the circuit design is assigned in the target IC. In one example, a node may be pin dependent only for purposes of behavioral simulation. The target IC is the particular IC in which the circuit design is to be implemented. As used within this disclosure, the term "pin independent" means that the characteristics of the node of a circuit design do not vary and/or depend upon the particular pin to which the node of the circuit design is assigned in the target IC. In one example, a node may be pin independent only for purposes of behavioral simulation.

Link block 125 links one or more different sections of circuit design 105. Linking, in reference to a circuit design, refers to a process where individual sections of the circuit design, as may be developed by one or more different design entities (e.g., users or groups of users) individually, are combined into the single larger circuit design or design project. For example, different RTL descriptions generated by different entities may be combined into a single larger RTL description. The circuit design, whether linked or not, may be specified as one or more RTL modules and may be hierarchically organized.

In some cases, pin planning block 130 may be performed following link block 125. The term "pin planning," as used herein, means assigning a node of a circuit design to a particular pin of the target IC. The pin may be an internal pin or an external pin. An external pin is an input/output (I/O) pin of the target IC. Pin planning may result in a different assignment of nodes to pins, e.g., changed pin assignments, and as such, changed pin configurations. In one example, pin planning block 130 may be a process where an EDA system makes pin assignments based upon received user instructions. As an illustrative example, the pin planning process may be performed manually by a user using the EDA system where the user manually specifies pin assignments. In another example, pin planning block 130 may be an automatic process where an EDA system automatically assigns nodes to pins.

In one example embodiment, performing pin planning block 130 may trigger update block 135. For instance, each time a pin planning operation is performed, update block 135 may be performed. Update block 135 may compare the current pin configuration for circuit design 105 as determined post pin planning block 130 with a prior pin configuration of circuit design 105. Since pin planning block 130 may be performed at different locations within the design flow, update block 135 may compare the current pin configuration after the most recent iteration of pin planning block 130 with the pin configuration in use for circuit design 105 for purposes of behavioral simulation. The pin configuration in use for behavioral simulation may be the default pin configuration or a different pin configuration from a prior iteration of pin planning block 130.

In any case, update block 135 may update circuit design 105 with the pin configuration determined or generated by pin planning block 130. The RTL of circuit design 105 may be updated with the new pin configuration. In one example embodiment, parameter values of modules of RTL may be updated to the values of the new pin configuration. Parameter values of pin dependent portions 115 of core sources 110 may be updated with values from the pin configuration determined in pin planning block 130. In another example embodiment, one or more portions of the original RTL may be replaced with different portions of RTL with the new pin configuration. For example, rather than updating particular parameters within the existing RTL, the pin dependent portions 115 may be replaced with newly generated pin dependent portions 115 generated by update block 135 after performing pin planning block 130.

The updated version of circuit design 105 after operation of update block 135 may be provided to behavioral simulation block 165. Behavioral simulation block 165 may perform a behavioral simulation using the updated version of circuit design 105 as updated by update block 135. As such, behavioral simulation block utilizes the same pin configuration that is later implemented within a target IC.

Synthesis block 140 synthesizes circuit design 105. Synthesis refers to the process of converting, or translating, an abstract, programmatic description of a circuit, e.g., an RTL description of circuit design 105, into a low-level design implementation. The low-level design implementation generated through synthesis typically is specified as interconnected logic gates.

Synthesis may also include mapping. Mapping is the process of correlating, or matching, the logic gates of the low-level circuit design to the various types of physical circuit blocks that are actually available in the target IC. For example, since a lookup table (LUT) may implement a complex function, one or more logic gates of the low-level design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

In one example embodiment, immediately following synthesis block 140, pin planning block 130 may operate on circuit design 105. One or more nodes of circuit design 105 may be assigned to pins. After pin planning block 130, update block 135 may be invoked as previously described.

Placement block 145 may place circuit design 105. Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned.

In one example, pin planning block 130 may be performed immediately following placement block 145. In some cases, the location of elements of circuit design 105 on the target IC post operation of placement block 145 affect the assignments of nodes to internal pins. The target IC, for example, may include one or more fixed circuit blocks (e.g., hardwired circuit blocks) having internal pins to which nodes of the circuit design may connect. For example, the target IC may include one or more hardwired buses. As such, the distance of a circuit element (a node or nodes of the circuit element) to the internal pin(s) of the fixed circuit block (e.g., bus) will affect timing parameters of the behavioral simulation. Placement block 145, therefore, influences pin planning block 130.

Accordingly, in another example embodiment, immediately following placement block 145, pin planning block 130 may operate on circuit design 105. One or more nodes of circuit design 105 may be assigned to pins (whether internal or external pins). After pin planning block 130, update block 135 may be invoked as previously described.

In another aspect, pin planning block 130 is integrated within and performed as part of placement block 145. In this regard, FIG. 1 is provided for purposes of illustration and is not intended to limit the inventive arrangements disclosed herein.

Routing block 150 can route circuit design 105. Routing is the process of selecting particular routing resources such as wires, programmable interconnection points (PIPs), PIP settings, and/or other interconnect circuitry to electrically couple the various circuit blocks of the target IC after placement.

Configuration bitstream generation block 155 may generate a configuration bitstream for the circuit design. Block 160 may implement the circuit design within the target IC. In one example, as part of block 160, the configuration bitstream generated in block 155 is loaded into the configuration memory of the target IC, thereby physically implementing the circuit design within the target IC.

Performing update block 135, by updating the behavioral description of circuit design 105 with updated and more accurate pin configuration(s), facilitates increased accuracy in behavioral simulation of the behavioral description of circuit design 105. Further, the behavioral simulation is better able to detect errors in signal routing that previously went undetected since the pin configurations used for behavioral simulation are the same as the pin configurations later implemented in the target IC.

Figure 2:
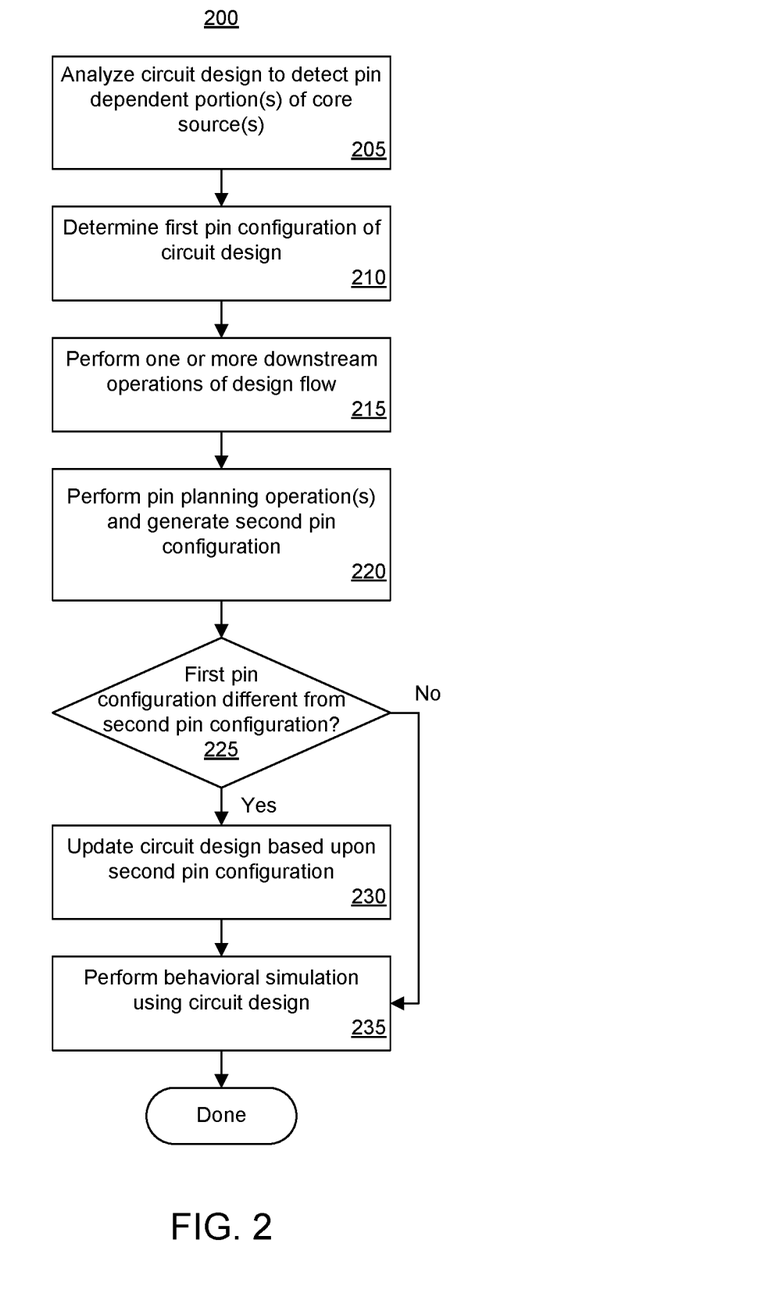
FIG. 2 is a flow chart illustrating an example method of performing simulation using implemented core sources.

FIG. 2 is a flow chart illustrating an example method 200 of performing simulation using implemented core sources. Method 200 can be performed by a system such as an EDA system as described herein in greater detail in connection with FIG. 3. Method 200 may begin in a state where a circuit design is specified with one or more core sources. For purposes of discussion, the circuit design is, at least initially, not linked (if required) and not synthesized.

In block 205, the system analyses the circuit design to detect any pin dependent portions of the core sources included in the circuit design. In block 210, the system determines a first pin configuration of the circuit design. The first pin configuration specifies an assignment of nodes of the circuit design to internal and/or to external pins of the target IC.

In block 215, the system performs one or more downstream operations of a design flow on the circuit design. In one example, the system performs link operation(s). In another example, the system performs synthesis. In another example, the system performs placement.

In block 220, the system performs one or more pin planning operations. As discussed, in one example, the pin planning operation(s) may be implemented automatically by the system. In another example, the pin planning operation(s) may be performed by the system, but establish assignments of nodes to pins responsive to specific assignment instructions received from a user. In any case, pin planning operation(s) may be performed as a separate stage of a design flow or integrated into one or more other of the noted stages of the design flow including an "optimization stage" of the design flow.

In performing block 220, the system generates, or determines, a second pin configuration of the circuit design. For example, the first pin configuration may be the pin configuration in existence prior to implementation of pin planning or a most recent pin planning operation. The second pin configuration may be the pin configuration in existence post pin planning operation or a most recent pin planning operation.

In block 225, the system can determine whether the first pin configuration is different from the second pin configuration. More particularly, the system can compare the first pin configuration with the second pin configuration to determine whether the second pin configuration differs from the first pin configuration. In one aspect, the system can compare the pin assignments of the first and second pin configurations. The system can determine whether at least one, or more, pin assignments of a given node of the circuit design to a pin of the target integrated circuit is different, or has changed, from the first pin configuration to the second pin configuration. In other words, in the event that a particular node is assigned to a first pin in the first pin configuration and to a second and different pin in the second pin configuration, the system determines that the two pin configurations are different. As discussed, the pin(s) of the assignments that are compared may be external pin(s), internal pin(s), or both.

If the first pin configuration differs from the second pin configuration, method 200 continues to block 230. If the first pin configuration does not differ from the second pin configuration, method 200 can proceed directly to block 235.

In block 230, the system updates the circuit design based upon the second pin configuration. As discussed, the system may update changed parameters within the existing RTL of the pin dependent portions of the circuit design and/or core source(s). In another example, the system may generate new pin dependent portions of RTL that include the second pin configuration and replace the pin dependent portions having the first pin configuration with the newly generated pin dependent portions having the second pin configuration.

In block 235, the system, or another system, may perform behavioral simulation using the circuit design. As such, the behavioral simulation uses the most accurate and up-to-date pin configuration for the circuit design resulting in increased timing accuracy for the behavioral simulation and the ability to detect pin connection errors.

The example embodiments described herein may be applied to any of a variety of different core sources that have pin dependent portions. These pin dependent portions may have dependencies on internal pins and/or external pins of the target IC. One example of a core source with a pin dependent portion is a memory interface core source. In conventional systems, memory interface core sources that are synthesized are not available for behavioral simulation. The memory interface core sources are simulated using a default pin configuration. This default pin configuration, however, changes to a custom pin configuration, e.g., a user and/or design specific pin configuration, post synthesis. The memory interface core source may be automatically updated with the custom pin configuration thereby seamlessly allowing the updated circuit design to be behaviorally simulated using the correct pin configuration post synthesis while also keeping the design flow intact.

In one example embodiment, the memory interface core source may be subdivided into a main memory controller core (DDR4, DDR3, RLDRAM3, QDRIIP, QDRIV) and a PHY (physical interface) core. The PHY core is a sub-core and contains the pin dependent RTL. The PHY core is sensitive to pin changes. Accordingly, the PHY core may be regenerated and synthesized during a later stage of the design flow. In one aspect, the PHY core may be regenerated and/or synthesized during a stage of the design flow called "optimization." During pin planning, the pin-out for the PHY core may be specified using the EDA system in accordance with the particular target IC that is selected, the circuit board on which the target IC is to be mounted (or coupled), and/or the circuit design itself.

The later synthesized PHY core, which may be expressed or stored as a design checkpoint (DCP) file or files, can be stitched, or incorporated, back to the main DCP for the circuit design. In one aspect, PHY core generation, synthesis, and/or stitching the implemented PHY core to the main DCP file may be implemented responsive to a command received by the EDA system. The command may be an "implement_<<cores>>" command, where <<cores>> is the name of the core source to be implemented. The command can be executed automatically during one or more stages of the design flow, e.g., the optimization stage. Later, the EDA system may generate the configuration bitstream also using the updated or customized pin configuration.

As discussed, the example embodiments described herein allow users to perform behavioral simulation with the memory interface core as actually implemented (with correct pin configuration) for implementation within the target IC. Otherwise, the RTL of the PHY core used in behavioral simulation would be different from the RTL of the PHY core actually used for configuration bitstream generation and/or implementation within the target IC. Since the RTL of the PHY core is pin dependent, the actual RTL of the PHY core used for configuration bitstream generation is generated only after pin planning is performed during the later stage(s) of the design flow. The example embodiments described herein can automatically update pin-dependent RTL of the circuit design thereby allowing the EDA system to automatically perform behavioral simulation on implemented RTL. In another example embodiment, the system may also track the changes to pin planning and update the RTL.

In one example embodiment, the system may have a command such as "implement_<<core>>-addtosources". The switch "-addtosources" may be provided to update the particular core source that is the subject of the "implement" command. In this example, without the switch, the system does not update the core source with the resulting pin configuration. The switch causes the synthesized core and pin dependent RTL output products to be added to the main project memory for the circuit design. The stitching of the pin dependent RTL of the core to the main memory core RTL for the circuit design may be performed.

In another example, the DCP file for the core source may include an attribute containing the parameterization or a CRC value that may be used to detect any changes to the parameterization (pin configuration) of the core source due to changes in pin assignment(s). For example, during designated stages of the design flow, e.g., pin planning, synthesis, placement, optimization, etc., the system may automatically check the parameterization and/or CRC value on the DCP file(s) with the value(s) generated from the current pin configuration of the circuit design. If the parameterization and/or CRC value matches the current pin configuration, the system determines that there has been no change to the pin configuration of the circuit design. If the system determines a mismatch, the system determines that the pin configurations do not match and the parameterization is updated with the current pin configuration.

In the paragraphs below, example parameters of core sources are described that may be changed and/or updated through a pin planning process. As discussed, the circuit design, or pin dependent portions of the circuit design, may be updated with the changed values post pin planning. In other examples, the pin dependent portion(s) may be replaced with newly generated RTL post pin planning.

A first example parameter is the PHY Map Parameter. The PHY Map Parameter indicates the placement of a port within an I/O bank/byte of an FPGA. Example default values for the PHY Map Parameter are illustrated below.

,parameter [39*BYTES-1:0] IOBTYPE={39'b000_011_
011_011_011_111_111_011_011_011_011_000_011,
39'b000_000_000_000_000_000_000_000_000_001_
001_001_001, 39'b001_001_001_000_000_001_001_
001_001_001_001_001_001, 39'b000_001_001_001_
001_101_101_001_001_001_001_001_001}

Updated values of the PHY Map Parameter post pin planning are shown below.

,parameter [39*BYTES-1:0] IOBTYPE={39'b000_011_011_011_011_111_111_011_011_011_011_000_011, 39'b000_000_000_000_000_000_000_000_000_000_000_000_000, 39'b000_000_000_000_000_000_000_000_000_000_000_000, 39'b000_000_000_000_000_000_000_000_000_000_000_000_000, 39'b000_001_001_001_001_101_101_001_001_001_001_001_001, 39'b000_000_000_000_000_000_000_000_000_000_000_000_000, 39'b000_001_001_000_000_001_001_001_001_001_001_001_001, 39'b000_000_000_000_000_000_000_000_001_001_001_001_001}

A second example parameter is the DDR Map Parameter. The DDR Map Parameter indicates whether the PLL is in the same bank as the data ports. A "1" means that the PLL is in the same bank as the data port, while a "0" indicates that the PLL is in a different bank than the data port. The default values assume the PLL is located in the same bank as the data port. Example default values for the DDR Map Parameter are illustrated below.

```
,.pll_clk0(
  {
    pll_clk[0],
    pll_clk[0],
    pll_clk[0],
    pll_clk[0]
  }
)
```

Updated values of the DDR Map Parameter post pin planning are shown below.

```
,.pll_clk0(
  {
    pll_clk[1],
    1'bx,
    1'bx,
    1'bx,
    pll_clk[0],
    1'bx,
    pll_clk[0],
    pll_clk[0]
  }
)
```

A third example parameter is the IOB Map Parameter. The IOB Map Parameter indicates where data pins are assigned in a byte and the size of the byte. Example default values for the IOB Map Parameter are illustrated below.

```
,.mcal_rd_vref_value(
  {
    mcal_rd_vref_value[6:0],
    7'b0,
    7'b0,
    7'b0
  }
)
```

Updated values of the IOB Map Parameter post pin planning are shown below.

```
,.mcal_rd_vref_value(
  {
    mcal_rd_vref_value[6:0],
    7'b0,
    7'b0,
    7'b0,
    7'b0,
    7'b0,
    7'b0,
    7'b0
  }
)
```

A fourth example parameter is the RIU Parameter. The RIU Parameter indicates, based upon placement of the port, the nibble count of the RIU address port. Example default values for the RIU Parameter are illustrated below.

```
28'h0010016:       begin          //c0_ddr4_adr[6]
  IO_L5P_T0U_N8_AD14P_44
  riu_addr_cal=6'hD;
  riu_nibble='h1;
end
28'h0010017:       begin          //c0_ddr4_adr[7]
  IO_L5N_T0U_N9_AD14N_44
  riu_addr_cal=6'hE;
  riu_nibble='h1;
end
```

Updated values of the RIU Parameter for the nibble count of the RIU address port post pin planning are shown below.

```
28'h0010016:       begin          //c0_ddr4_adr[6]
  IO_L23P_T3U_N8_44
  riu_addr_cal=6'hD;
  riu_nibble='h7;
end
28'h0010017:       begin          //c0_ddr4_adr[7]
  IO_L23N_T3U_N9_44
  riu_addr_cal=6'hE;
  riu_nibble='h7;
end
```

Figure 3:
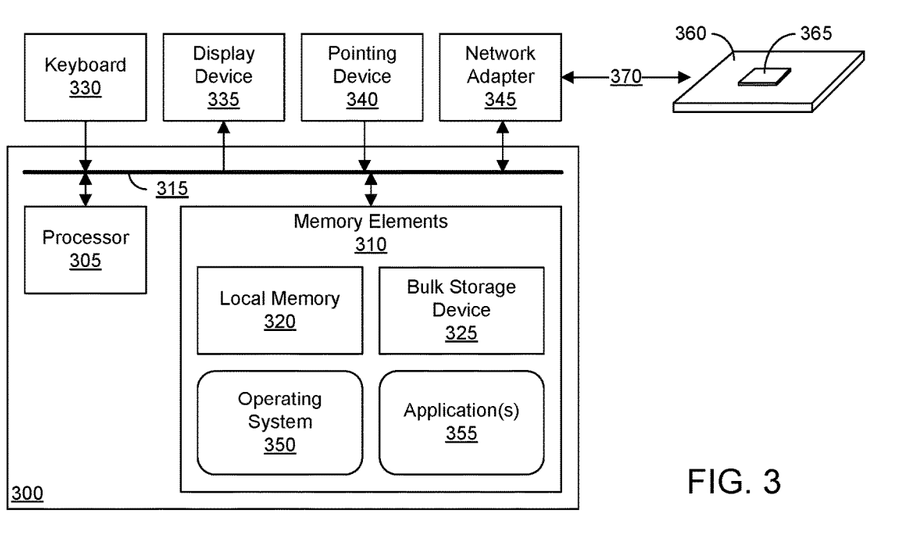
FIG. 3 is a block diagram illustrating an example data processing system.

FIG. 3 is a block diagram illustrating an example data processing system (system) 300. System 300, in executing suitable software, is also an example of an EDA system. System 300 may be used to perform the various operations described herein.

As pictured, system 300 includes at least one processor 305 coupled to memory elements 310 through a system bus 315 or other suitable circuitry such as an input/output (I/O) subsystem. System 300 stores computer readable instructions (also referred to as "program code") within memory elements 310. Memory elements 310 may be considered an example of computer readable storage media. Processor 305 executes the program code accessed from memory elements 310 via system bus 315.

Memory elements 310 include one or more physical memory devices such as, for example, a local memory 320 and one or more bulk storage devices 325. Local memory 320 refers to random access memory (RAM) or other non-persistent memory device(s) generally used during actual execution of the program code. Bulk storage device 325 may be implemented as a hard disk drive (HDD), solid state drive (SSD), or other persistent data storage device. System 300 may also include one or more cache memories (not shown) that provide temporary storage of at least some program code in order to reduce the number of times program code must be retrieved from bulk storage device 325 during execution.

System 300 may be coupled to one or more I/O devices such as a keyboard 330, a display device 335, a pointing device 340, and/or one or more network adapters 345. System 300 may include one or more additional I/O device(s) beyond the examples provided. The I/O devices described herein may be coupled to system 300 either directly or through intervening I/O controllers. In some cases, one or more of the I/O device(s) may be combined as in the case where a touch sensitive display device 335 (e.g., a touchscreen) is used. In that case, display device 335 may also implement keyboard 330 and/or pointing device 340.

Network adapter 345 is a communication circuit configured to establish wired and/or wireless communication links with other devices. The communication links may be established over a network or as peer-to-peer communication links. Accordingly, network adapter 345 enables system 300 to become coupled to other systems, computer systems, remote printers, and/or remote storage devices. Example network adapter(s) 345 may include, but are not limited to, modems, cable modems, Ethernet cards, bus adapters or connectors, wireless transceivers, whether short and/or long range wireless transceivers (e.g., cellular transceivers, 802.11x (Wi-Fi™) compatible transceivers, Bluetooth® compatible transceivers, and the like).

As pictured, memory elements 310 may store an operating system 350 and one or more application(s) 355. Application 355, for example, may be an EDA application. In one aspect, operating system 350 and application(s) 355, being implemented in the form of executable program code, are executed by system 300 and, more particularly, by processor 305, to perform the various operations described within this disclosure. As such, operating system 350 and application(s) 355 may be considered an integrated part of system 300. Operating system 350, application(s) 355, and any data items used, generated, and/or operated upon by system 300 such as circuit designs, RTL, configuration bitstream(s), pin configurations, and so forth are functional data structures that impart functionality when employed as part of system 300 or are provided to a target IC for implementation therein.

As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

System 300 may include fewer components than shown or additional components not illustrated in FIG. 3 depending upon the particular type of device that is implemented. In addition, the particular operating system and/or application(s) included may also vary according to device type as may the types of network adapter(s) included. Further, one or more of the illustrative components may be incorporated into, or otherwise form a portion of, another component. For example, a processor may include at least some memory.

In another arrangement, system 300 may be coupled to a platform 360 through a communication link 370. In one example, system 300 may be coupled to platform 360 through network adapter 345. In another example, system 300 may include one or more other I/O devices such as Universal Serial Bus (USB) interface, or other communication port that may be used to couple system 300 to platform 360.

Platform 360 may be a circuit board or card and have target hardware such as a target IC 365 coupled thereto. In one arrangement, target IC 365 may be implemented as a programmable IC such as field programmable gate array, or an ASIC. System 300 may be configured to provide or download a circuit design, e.g., a configuration bitstream specifying the circuit design, to target IC 365. With the circuit design loaded into target IC 365, the circuit design is physically implemented within target IC 365.

Figure 4:
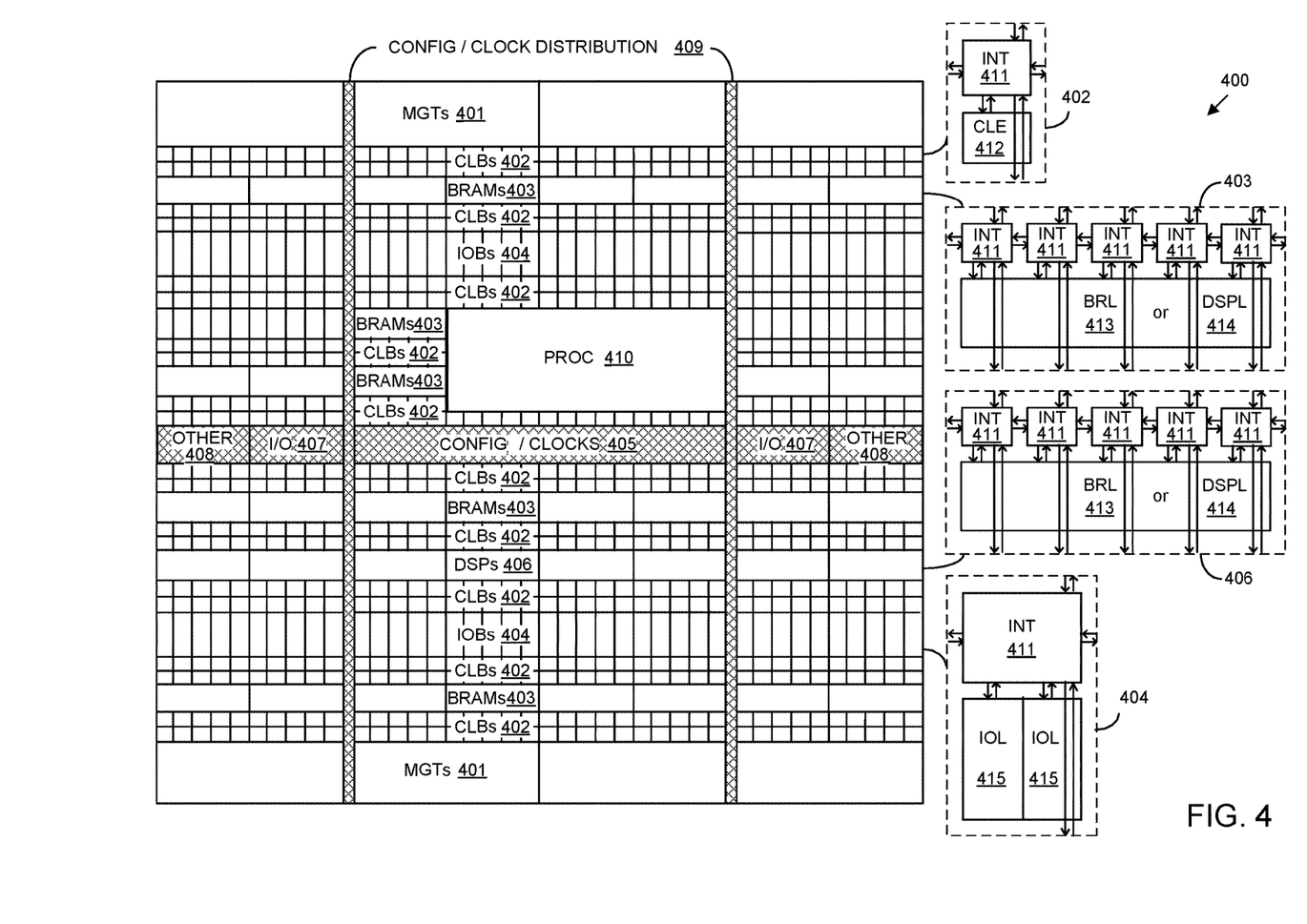
FIG. 4 is a block diagram illustrating an exemplary architecture for an integrated circuit.

FIG. 4 is a block diagram illustrating an exemplary architecture 400 for an IC. Architecture 400 may be used for a target IC such as a programmable IC. For example, architecture 400 may be used to implement a field programmable gate array (FPGA). Architecture 400 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 400 includes several different types of programmable circuit, e.g., logic, blocks. For example, architecture 400 may include a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized I/O blocks 407 (e.g., configuration ports and clock ports), and other programmable logic 408 such as digital clock managers, analog-to-digital converters, system monitoring logic, and so forth.

In some ICs, each programmable tile includes a programmable interconnect element (INT) 411 having standardized connections to and from a corresponding INT 411 in each adjacent tile. Therefore, INTs 411, taken together, implement the programmable interconnect structure for the illustrated IC. Each INT 411 also includes the connections to and from the programmable logic element within the same tile, as shown by the examples included at the top of FIG. 4.

For example, a CLB 402 may include a configurable logic element (CLE) 412 that may be programmed to implement user logic plus a single INT 411. A BRAM 403 may include a BRAM logic element (BRL) 413 in addition to one or more INTs 411. Typically, the number of INTs 411 included in a tile depends on the height of the tile. As pictured, a BRAM tile has the same height as five CLBs, but other numbers (e.g., four) also may be used. A DSP tile 406 may include a DSP logic element (DSPL) 414 in addition to an appropriate number of INTs 411. An IOB 404 may include, for example, two instances of an I/O logic element (IOL) 415 in addition to one instance of an INT 411. The actual I/O pads (and/or external pins) connected to IOL 415 may not be confined to the area of IOL 415.

In the example pictured in FIG. 4, a columnar area near the center of the die, e.g., formed of regions 405, 407, and 408, may be used for configuration, clock, and other control logic. Horizontal areas 409 extending from this column may be used to distribute the clocks and configuration signals across the breadth of the programmable IC.

Some ICs utilizing the architecture illustrated in FIG. 4 include additional logic blocks that disrupt the regular columnar structure making up a large part of the IC. The additional logic blocks may be programmable blocks and/or dedicated circuitry. For example, a processor block depicted as PROC 410 spans several columns of CLBs and BRAMs.

In one aspect, PROC 410 may be implemented as dedicated circuitry, e.g., as a hardwired processor, that is fabricated as part of the die that implements the programmable circuitry of the IC. PROC 410 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 410 may be omitted from architecture 400 and replaced with one or more of the other varieties of the programmable blocks described. Further, such blocks may be utilized to form a "soft processor" in that the various blocks of programmable circuitry may be used to form a processor that can execute program code as is the case with PROC 410.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 4 that are external to PROC 410 such as CLBs 402 and BRAMs 403 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 410.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 410 or a soft processor. In some cases, architecture 400 includes a dedicated configuration processor that loads the configuration bitstream to the appropriate configuration memory and/or processor memory. The dedicated configuration processor does not execute user-specified program code. In other cases, architecture 400 may utilize PROC 410 to receive the configuration bitstream, load the configuration bitstream into appropriate configuration memory, and/or extract program code for execution.

FIG. 4 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 4 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 410 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "hardware description language" is a computer-language that facilitates the documentation, design, and manufacturing of a digital system, such as an integrated circuit. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined herein, the term "core" means a pre-designed and reusable unit of logic, cell, or chip layout design in the field of electronic circuit design. A core, sometimes referred to as an "Intellectual Property Core" or "IP," is expressed programmatically as a description of hardware that performs a particular function. A core may be expressed using hardware description language file(s), as a netlist, as a bitstream that programs a programmable IC, or the like. A core may be used as a building block within an application-specific integrated circuit chip design or within a programmable IC circuit design, e.g., an FPGA circuit design. As defined herein, the term "core source" means a core specified using an editable syntax. An example of a core source is a core specified as an RTL description.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of using pin planning for core sources can include identifying, using a processor, a first pin configuration and a second pin configuration for a core source of a behavioral description of a circuit design, wherein the second pin configuration is generated by a pin planning operation, comparing, using the processor, the first pin configuration of the core source with the second pin configuration of the core source, and, responsive to detecting a difference between the first pin configuration and the second pin configuration, automatically updating, using the processor, the core source based upon the second pin configuration.

The method can include performing behavioral simulation of the circuit design with the updated core source.

The comparing can include determining whether an assignment of a node to a pin of a target integrated circuit has changed from the first pin configuration to the second pin configuration. In one aspect, the pin is an external pin of the target integrated circuit. In another aspect, the pin is an internal pin of the target integrated circuit.

In one aspect, the updating can include replacing a pin dependent portion of the core source specifying the first pin configuration with an updated pin dependent portion of the core source specifying the second pin configuration.

In another aspect, the updating can include modifying a value of a parameter of a pin dependent portion of the core source.

A system for pin planning for core sources includes a processor configured to initiate executable operations. The executable operations can include identifying a first pin configuration and a second pin configuration for a core source of a behavioral description of a circuit design, wherein the second pin configuration is generated by a pin planning operation, comparing the first pin configuration of the core source with the second pin configuration of the core source, and, responsive to detecting a difference between the first pin configuration and the second pin configuration, automatically updating the core source based upon the second pin configuration.

The executable operations can include performing behavioral simulation of the circuit design with the updated core source.

The comparing can include determining whether an assignment of a node to a pin of a target integrated circuit has changed from the first pin configuration to the second pin configuration. In one aspect, the pin is an external pin of the target integrated circuit. In another aspect, the pin is an internal pin of the target integrated circuit.

In one aspect, the updating can include replacing a pin dependent portion of the core source specifying the first pin configuration with an updated pin dependent portion of the core source specifying the second pin configuration.

In another aspect, the updating can include modifying a value of a parameter of a pin dependent portion of the core source.

A computer program product includes a computer readable storage medium having program code stored thereon. The program code is executable by a processor to perform operations for using pin planning for core sources. The operations can include identifying, using the processor, a first pin configuration and a second pin configuration for a core source of a behavioral description of a circuit design, wherein the second pin configuration is generated by a pin planning operation, comparing, using the processor, the first pin configuration of the core source with the second pin configuration of the core source, and, responsive to detecting a difference between the first pin configuration and the second pin configuration, automatically updating, using the processor, the core source based upon the second pin configuration.

The operations can include performing behavioral simulation of the circuit design with the updated core source.

The comparing can include determining whether an assignment of a node to a pin of a target integrated circuit has changed from the first pin configuration to the second pin configuration. The pin is an external pin of the target integrated circuit or an internal pin of the target integrated circuit.

In another aspect, the updating can include replacing a pin dependent portion of the core source specifying the first pin configuration with an updated pin dependent portion of the core source specifying the second pin configuration.

In another aspect, the updating can include modifying a value of a parameter of a pin dependent portion of the core source.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of using pin planning for core sources, comprising:
processing, using a processor, a circuit design including a core source through at least part of a design flow that includes a pin planning operation, wherein the core source includes a register transfer level description of circuitry having a first pin configuration;
comparing, using the processor, the first pin configuration of the core source with a second pin configuration of the core source subsequent to performing the at least part of the design flow;
responsive to detecting a difference between the first pin configuration and the second pin configuration from the comparing, automatically updating, using the processor, the core source by updating a portion of the first pin configuration with a portion of the second pin configuration that differed from the first pin configuration;
wherein the updating includes replacing a pin dependent portion of the core source specifying the first pin configuration with an updated pin dependent portion of the core source specifying the second pin configuration; and
performing behavioral simulation of the circuit design using the updated core source;
wherein the core source corresponds to a memory interface, a pin independent portion of the core source corresponds to a memory controller of the memory interface, and the pin dependent portion corresponds to a physical interface of the memory interface.

2. The method of claim 1, wherein the behavioral simulation of the circuit design using the updated core source correlates with the circuit design subsequent to performing the design flow as implemented within an integrated circuit.

3. The method of claim 1, wherein the comparing comprises:
determining whether an assignment of a node to a pin of a target integrated circuit has changed from the first pin configuration to the second pin configuration.

4. The method of claim 3, wherein the pin is an external pin of the target integrated circuit.

5. The method of claim 3, wherein the pin is an internal pin of the target integrated circuit.

6. The method of claim 1, wherein the at least part of a design flow includes synthesis.

7. The method of claim 1, wherein the at least part of a design flow includes placement.

8. A system for using pin planning for core sources, comprising:
a processor configured to initiate executable operations including:
processing a circuit design including a core source through at least part of a design flow that includes a pin planning operation, wherein the core source includes a register transfer level description of circuitry having a first pin configuration;
comparing the first pin configuration of the core source with a second pin configuration of the core source subsequent to performing the at least a part of the design flow;
responsive to detecting a difference between the first pin configuration and the second pin configuration from the comparing, automatically updating the core source by updating a portion of the first pin configuration with a portion of the second pin configuration that differed from the first pin configuration;
wherein the updating includes replacing a pin dependent portion of the core source specifying the first pin configuration with an updated pin dependent portion of the core source specifying the second pin configuration; and
performing behavioral simulation of the circuit design using the updated core source;
wherein the core source corresponds to a memory interface, a pin independent portion of the core source corresponds to a memory controller of the memory interface, and the pin dependent portion corresponds to a physical interface of the memory interface.

9. The system of claim 8, wherein the behavioral simulation of the circuit design using the updated core source correlates with the circuit design subsequent to performing the design flow as implemented within an integrated circuit.

10. The system of claim 8, wherein the comparing comprises:
determining whether an assignment of a node to a pin of a target integrated circuit has changed from the first pin configuration to the second pin configuration.

11. The system of claim 10, wherein the pin is an external pin of the target integrated circuit.

12. The system of claim 10, wherein the pin is an internal pin of the target integrated circuit.

13. The system of claim 8, wherein the at least part of a design flow includes synthesis.

14. The system of claim 8, wherein the at least part of a design flow includes placement.

15. A computer program product comprising a computer readable storage medium having program code stored thereon, the program code executable by a processor to perform operations for using pin planning for core sources, comprising:
processing, using the processor, a circuit design including a core source through at least part of a design flow that includes a pin planning operation, wherein the core source includes a register transfer level description of circuitry having a first pin configuration;
comparing, using the processor, the first pin configuration of a core source with the second pin configuration of the core source subsequent to performing the at least a part of the design flow;
responsive to detecting a difference between the first pin configuration and the second pin configuration from the comparing, automatically updating, using the processor, the core source by updating a portion of the first pin configuration with a portion of the second pin configuration that differed from the first pin configuration; and
wherein the updating includes replacing a pin dependent portion of the core source specifying the first pin configuration with an updated pin dependent portion of the core source specifying the second pin configuration; and
performing behavioral simulation of the circuit design using the updated core source;

wherein the core source corresponds to a memory interface, a pin independent portion of the core source corresponds to a memory controller of the memory interface, and the pin dependent portion corresponds to a physical interface of the memory interface.

16. The computer program product of claim 15, wherein the behavioral simulation of the circuit design using the updated core source correlates with the circuit design subsequent to performing the design flow as implemented within an integrated circuit.

17. The computer program product of claim 15, wherein the comparing comprises:
    determining whether an assignment of a node to a pin of a target integrated circuit has changed from the first pin configuration to the second pin configuration.

18. The computer program product of claim 17, wherein the pin is an external pin of the target integrated circuit or an internal pin of the target integrated circuit.

19. The computer program product of claim 15, wherein the at least part of a design flow includes synthesis.

20. The computer program product of claim 15, wherein the at least part of a design flow includes placement.

* * * * *